(12) United States Patent
Kim

(10) Patent No.: US 7,075,461 B2
(45) Date of Patent: Jul. 11, 2006

(54) METHOD OF GENERATING PSEUDO 8B/10B CODE AND APPARATUS FOR GENERATING THE SAME

(75) Inventor: Jong-Seok Kim, Bucheon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/793,819

(22) Filed: Mar. 8, 2004

(65) Prior Publication Data

US 2005/0040975 A1    Feb. 24, 2005

(30) Foreign Application Priority Data

Aug. 18, 2003   (KR) ................. 10-2003-0056813

(51) Int. Cl.
*H03M 5/00*    (2006.01)
(52) U.S. Cl. ..................... 341/58; 341/59; 341/102
(58) Field of Classification Search ................. 341/50, 341/59, 58, 102
See application file for complete search history.

(56) References Cited

U.S. PATENT DOCUMENTS

| | | | | |
|---|---|---|---|---|
| 4,486,739 A | * | 12/1984 | Franaszek et al. | 341/59 |
| 4,626,826 A | * | 12/1986 | Fukuda et al. | 341/58 |
| 5,245,339 A | * | 9/1993 | Cideciyan | 341/95 |
| 5,537,112 A | * | 7/1996 | Tsang | 341/59 |
| 6,225,924 B1 | * | 5/2001 | Epshtein et al. | 341/106 |
| 6,323,787 B1 | * | 11/2001 | Yamashita | 341/58 |
| 6,501,396 B1 | * | 12/2002 | Kryzak et al. | 341/59 |
| 6,653,957 B1 | * | 11/2003 | Patterson et al. | 341/100 |
| 6,700,510 B1 | * | 3/2004 | Kryzak et al. | 341/59 |
| 2004/0155801 A1 | * | 8/2004 | Lund et al. | 341/59 |

OTHER PUBLICATIONS

Gigabit Ethernet, URL=http://www.cisco.com/en/US/about/ac123/ac147/ac174/ac199/about_cisco_ipj_archive_article09186a00800c85a6.html, Sep. 1999.
Storage Networking Building Blocks, URL=http://www.awprofessional.com/articles/article.ASP?p=25863&seqNUM=5.; Mar. 8, 2002.
Lattice Reference Designs 8b/10b Encoder/Decoder, URL=http://www.latticesemiconductor.com/products/devtools/ip/refdesigns/8b_10b_encoder_decoder.cfm?qsmod=1, 200.
Excerpt of U.S. Patent No. 6,768,429, URL=http://patft.uspto.gov/netacgi/nph-Parser?Sect1=PTO1&Sec2=HITOFF&d=PALL&p=1&u=/netahtml/srchnum.htm&r=1&f=G&1=50&s1=6768429.  WKU.&OS=PN/6768429&RS=PN/6768429; Apr. 27, 2004.
Ivry, Raanan, FEC and Line Coding for EFM, Breadlight, Oct. 12, 2001, URL=http://www.ieee802.org/3/efm/public/sep01/ivry_1_0901.pdf.
R. Mita et al., "A Novel Pseudo Random Bit Generator for Cryptography Applications" 2002 pp. 489-492, no month.

* cited by examiner

*Primary Examiner*—Peguy JeanPierre
(74) *Attorney, Agent, or Firm*—Harness, Dickey & Pierce, P.L.C.

(57) ABSTRACT

A method of generating an 8B/10B-like code bit sequence that is similar to an 8B/10B code may include: generating a parallel pseudo random bit sequence having N bits wherein N is an integer and N≧2; and transforming the parallel pseudo random bit sequence into a parallel first bit sequence that is similar to an 8B/10B code, a number Q of consecutive "0"s or "1"s of the first bit sequence being Q≦M1, wherein Q and M1 are integers and M<N. Devices related to such a method are also provided.

27 Claims, 14 Drawing Sheets

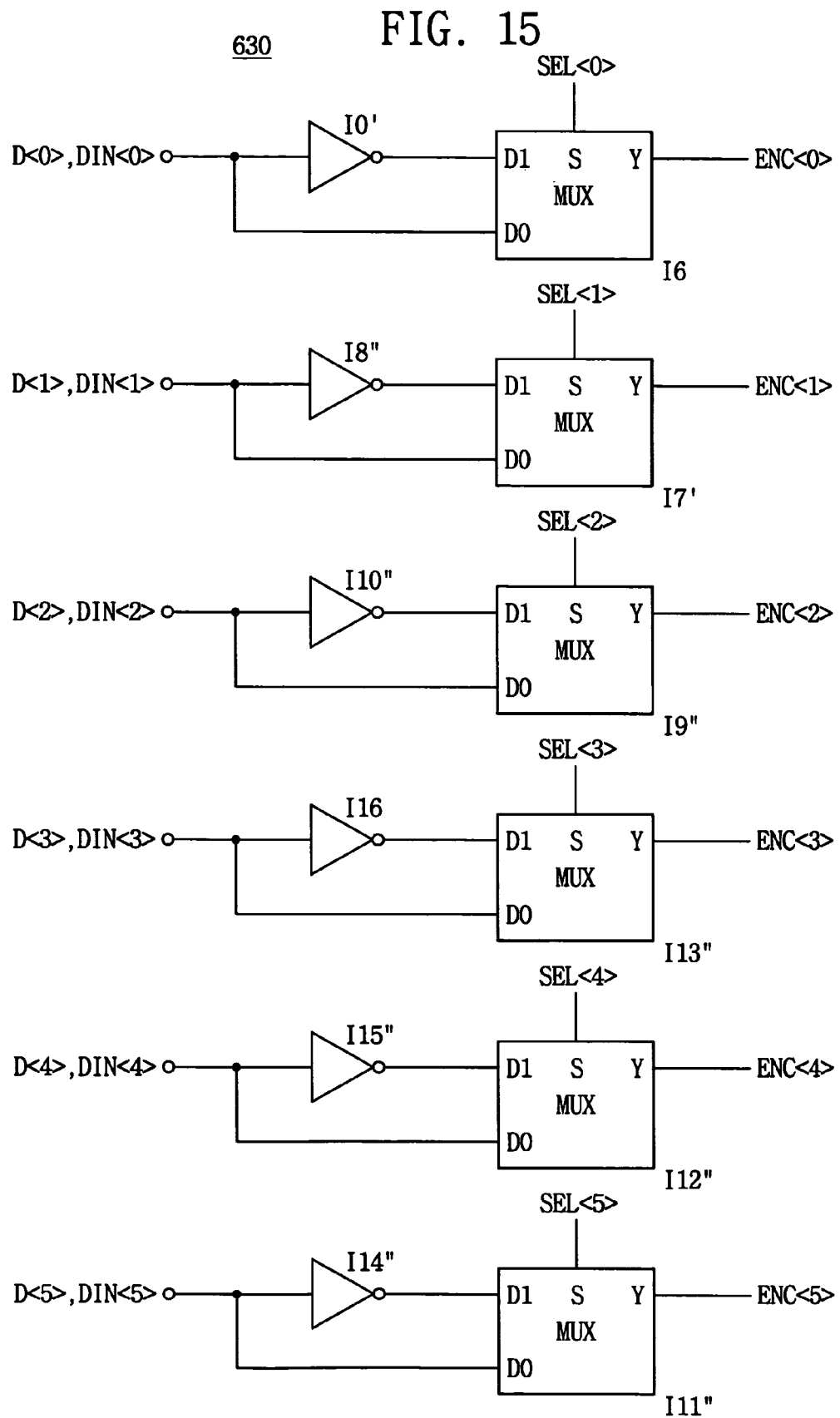

FIG. 16    640
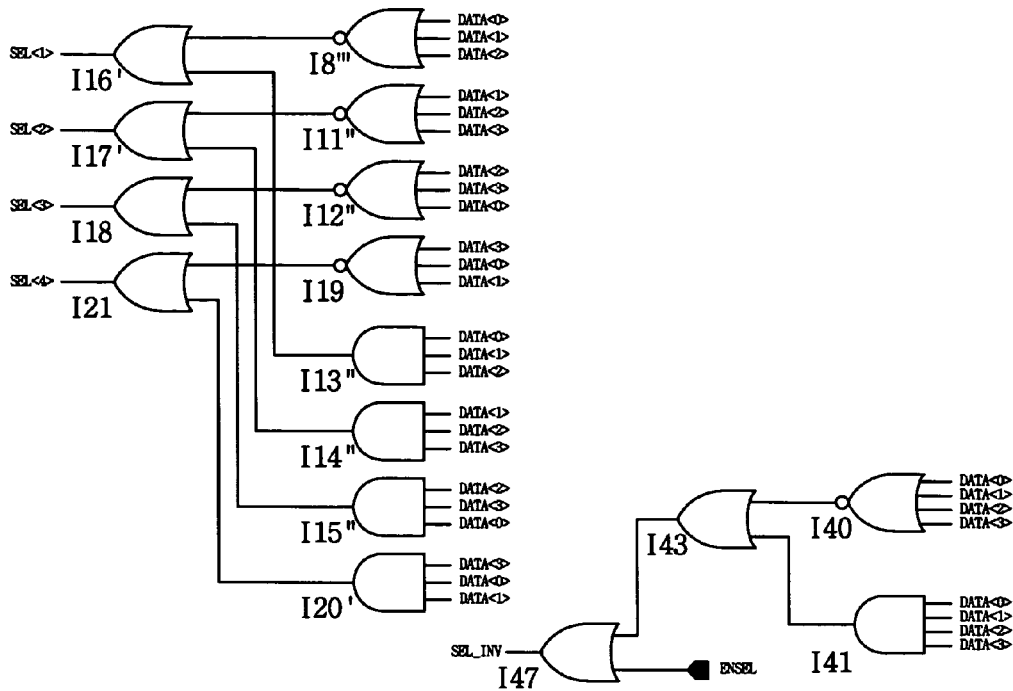
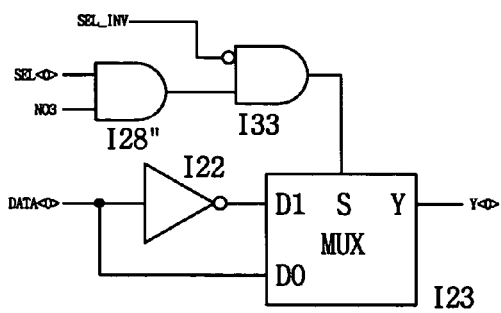
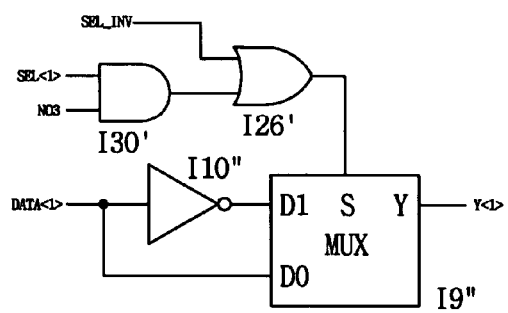
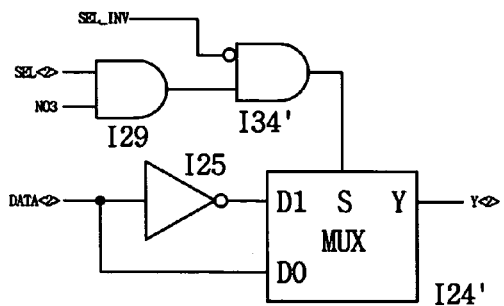
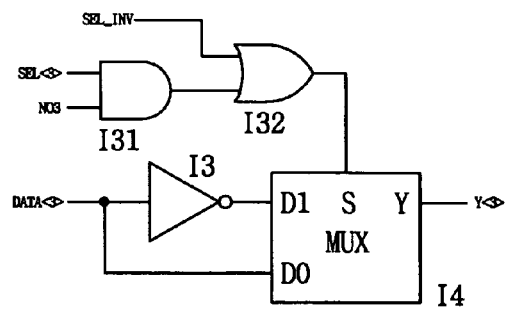

METHOD OF GENERATING PSEUDO 8B/10B CODE AND APPARATUS FOR GENERATING THE SAME

CROSS-REFERENCE TO RELATED APPLICATIONS

This application relies for priority upon Korean Patent Application No. 2003-56813 filed on Aug. 18, 2003, the contents of which are herein incorporated by reference in its entirety.

BACKGROUND OF THE PRESENT INVENTION

1. Field of the Invention

The present invention relates to a method of generating a data pattern similar to an 8B/10B code and an apparatus for generating such a data pattern, more particularly to a method of generating such a data pattern as a test pattern for verifying the performance of a serializer and an apparatus for generating such a data pattern.

2. Description of the Related Art

Recently, high-speed I/O (Input/Output) interface devices are usually used in order to overcome the limit of parallel data bus.

FIG. 1 is a schematic view of the Related Art showing a general n:1 serializer 100, which is an example of a high-speed I/O interface device, and FIG. 2 is a schematic view of the Related Art showing a waveform of serialized data output from n:1 serializer 100 of FIG. 1.

Referring to FIGS. 1 and 2, data D<1>, D<2>, ..., D<n−1> are provided in parallel to, and serialized by, serializer 100. Thus, serialized data D<1>, D<2>, ... D<n−1> are sequentially output from serializer 100. The performance of serializer 100 can be tested by providing its parallel input terminals with a PRBS test pattern (in parallel).

A known pseudo random bit sequence (PRBS) generator stores a data pattern in memory, e.g., in a ROM (Read Only Memory) table, and generates the data pattern by reading from the memory. The known PRBS generator using the ROM table is well suited to a test device for which physical size and power consumption are not significant design constraints. However, the known PRBS generator using the ROM table is not well suited to being implemented in a semiconductor chip which typically should consume a small area and a small amount of power.

FIG. 3 is a schematic view of the Related Art showing such a general PRBS generator 300, and FIG. 4 is a timing diagram showing an output X1 of PRBS generator 300 of FIG. 3. PRBS generator 300 of FIG. 3 implements the polynomial of $f(x)=X^7+X^6+1$.

Referring to FIG. 3, PRBS generator 300 is formed of cascade-connected shift registers SR1–SR7. Signals X1 and X2, which are the outputs of shift registers SR1 and SR2, are input to an XOR gate 301. A signal X8, which is the output of XOR gate 301, can be described as $X8(n)=X1(n) \oplus X2(n)$. Shift registers SR1 through SR7 respectively have a non-zero initial value. A PRBS is outputted in synchronization with a clock signal CLK from PRBS generator 300. For example, as shown in FIG. 4 (according to the Related Art), PRBS generator 300 outputs signal X1 having a random binary value in synchronization with clock signal CLK.

An example of a known 8 bit PRBS generator, which is used as a parallel scrambler of an ATM (Asynchronous Transfer Mode) exchange, is disclosed in U.S. Patent Application laid-open publication-No. 2002/0051542 (entitled "PARALLEL SCRAMBLER OF EXCHANGE IN ASYNCHRONOUS TRANSFER MODE").

In a wire-connected (hereafter, wired) communication network, data are typically encoded into an 8B/10B code (in which 8 bit bytes are encoded into 10 bit bytes) and the 8B/10B code is transmitted/received via wire-connections through the communication network. The Related Art PRBS that is used as a test pattern for the Related Art serializer significantly differs from the 8B/10B code. For example, such a Related Art PRBS test pattern can have seven consecutive "1" ( ... 1111111 ... ), or six consecutive "0"s ( ... 000000 ... ).

SUMMARY OF THE PRESENT INVENTION

Accordingly, the present invention is provided to substantially obviate one or more problems due to limitations and disadvantages of the related art.

An embodiment of the present invention to provides a method of generating a data pattern that can be described as a pseudo 8B/10B code (or, in other words, an 8B/10B-like code).

Another embodiment of the present invention provides an apparatus for generating such an 8B/10B-like code bit sequence.

Another embodiment of the present invention provides a method of generating a 8B/10B-like code bit sequence that is similar to an 8B/10B code. Such a method may include: generating a parallel pseudo random bit sequence having N bits wherein N is an integer and $N \geq 2$; and transforming the parallel pseudo random bit sequence into a parallel first bit sequence that is similar to an 8B/10B code, a number Q of consecutive "0"s or "1"s of the first bit sequence being $Q \leq M1$, wherein Q and M1 are integers and M<N.

Another embodiment of the present invention provides an apparatus for generating an 8B/10B-like code bit sequence that is similar to an 8B/10B code. Such an apparatus may include: a pseudo random bit sequence generator operable to generate a parallel pseudo random bit sequence having N bits wherein N is an integer and $N \geq 2$; and an 8B/10B-like code generating section operable to transform the pseudo random bit sequence into a parallel first bit sequence that is similar to the 8B/10B code, a number Q of consecutive "0"s or "1"s of the first bit sequence being $Q \leq M1$ wherein Q and M1 are integers and M1<N.

Another embodiment of the present invention provides a parallel pseudo random bit sequence (PRBS) generator. Such a PRBS may include: P stages, where N is an integer and P 10; each stage including an exclusive-OR (XOR) gate having two inputs and a flip-flop (FF), the output of the XOR gate being provided to the data input of the FF and the output signal d<i> of the FF representing the output of an $i^{th}$ stage. The output signals d<0>, d<1>, ..., d<8> and d<9> represent a PRBS, and there are two types of feedback connections for the stages. The first type includes input<iA>=d<i+3> and input<iB>=d<i+4> for inputs A and B of the ith stage, respectively. The second type includes input<jA>=d<j−4> and input<jB>=j−2>, for inputs A and B of the jth stage, respectively.

Another embodiment of the present invention provides a method of generating an 8B/10B-like code bit sequence that is similar to an 8B/10B code. Such a method may include: generating a pseudo random bit sequence (PRBS); and forming an 8B/10B-like code based upon the PRBS.

An advantage of such a PRBS generator according to embodiments of the invention is that it can be implemented with via a simple configuration having relatively few XOR gates and flip flops, which eases implementation, etc.

Additional features and advantages of the invention will be more fully apparent from the following detailed description of example embodiments, the accompanying drawings and the associated claims.

BRIEF DESCRIPTION OF THE DRAWINGS

The above and other advantages of the present invention will become more apparent by describing in detail example embodiments thereof with reference to the accompanying drawings, in which:

FIG. 15 is a circuit diagram according to an embodiment of the present invention showing in more detail an implementation of a first inverting section of FIG. 8; and FIG. 16 is a circuit diagram according to an embodiment of the present invention showing in more detail an implementation of a second inverting section of FIG. 8.

DESCRIPTION OF EXAMPLE EMBODIMENTS

Hereinafter, the example embodiments of the present invention will be described in detail with reference to the accompanying drawings.

In developing the present invention, the following problem with the Background Art was recognized and a path to its solution identified. The Background Art provides a PRBS for use as data by which to test the performance of serializer 100. But serializer 100 typically operates upon an 8B/10B code. It is a problem, e.g., in terms of testing accuracy, etc., that the Background Art tests serializer 100 with data that is significantly different than what is operated upon typically by serializer 100. At least one embodiment of the present invention provides an 8B/10B-like code bit sequence that is significantly closer to the actual 8B/10B code than a PRBS and which, e.g., can be used as data to more accurately test the performance of a high-speed interface device such as serializer 100.

Figure 5:
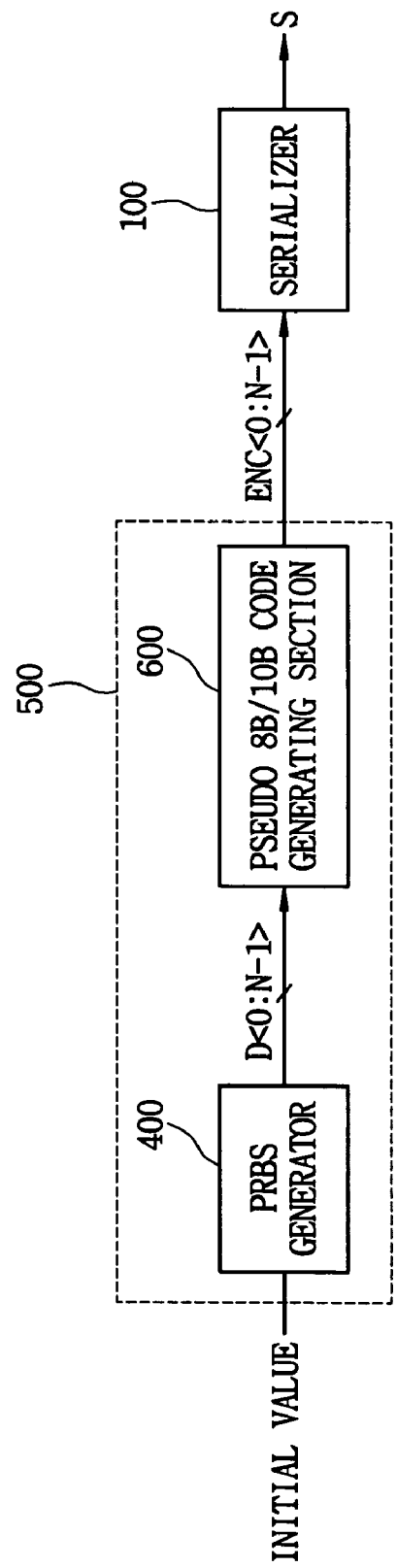
FIG. 5 is a block diagram showing an 8B/10B-like code generator according to an embodiment of the present invention.

FIG. 5 is a block diagram showing a 8B/10B-like code generator 500 according to an embodiment of the present invention.

Referring to FIG. 5, 8B/10B-like code generator 500 includes a PRBS generator 400 and an 8B/10B-like code generating section 600.

PRBS generator 400 generates a parallel pseudo random bit sequence d<0>, d<1>, d<2>, . . . , d<n−1> (hereinafter, d<0:n−1>). Sequence d<0:n−1> is used to verify/test the performance of a high-speed interface device, e.g., a serializer 100. For example, n may be 10 (n=10) because 8B/10B-encoded (10-bit) data are typically transmitted/received via a wire-connected (again, wired) communication network.

8B/10B-like code bit sequence generating section 600 receives the output of PRBS generator 400 and operates upon it to generate parallel bit sequences that are similar to the 8B/10B code and hence are described as 8B/10B-like code. In particular, 8B/10B-like code generating section 600 generates a parallel bit sequence enc<0>, enc<1>, . . . , enc<n−1> (hereinafter, enc<0:n−1>), where enc<0:n−1> represent the 8B/10B-like code sequence. Parallel bit sequence enc<0:n−1> can be provided as a test pattern for verifying the performance of a high speed interface device, e.g., serializer 100.

Figure 6:
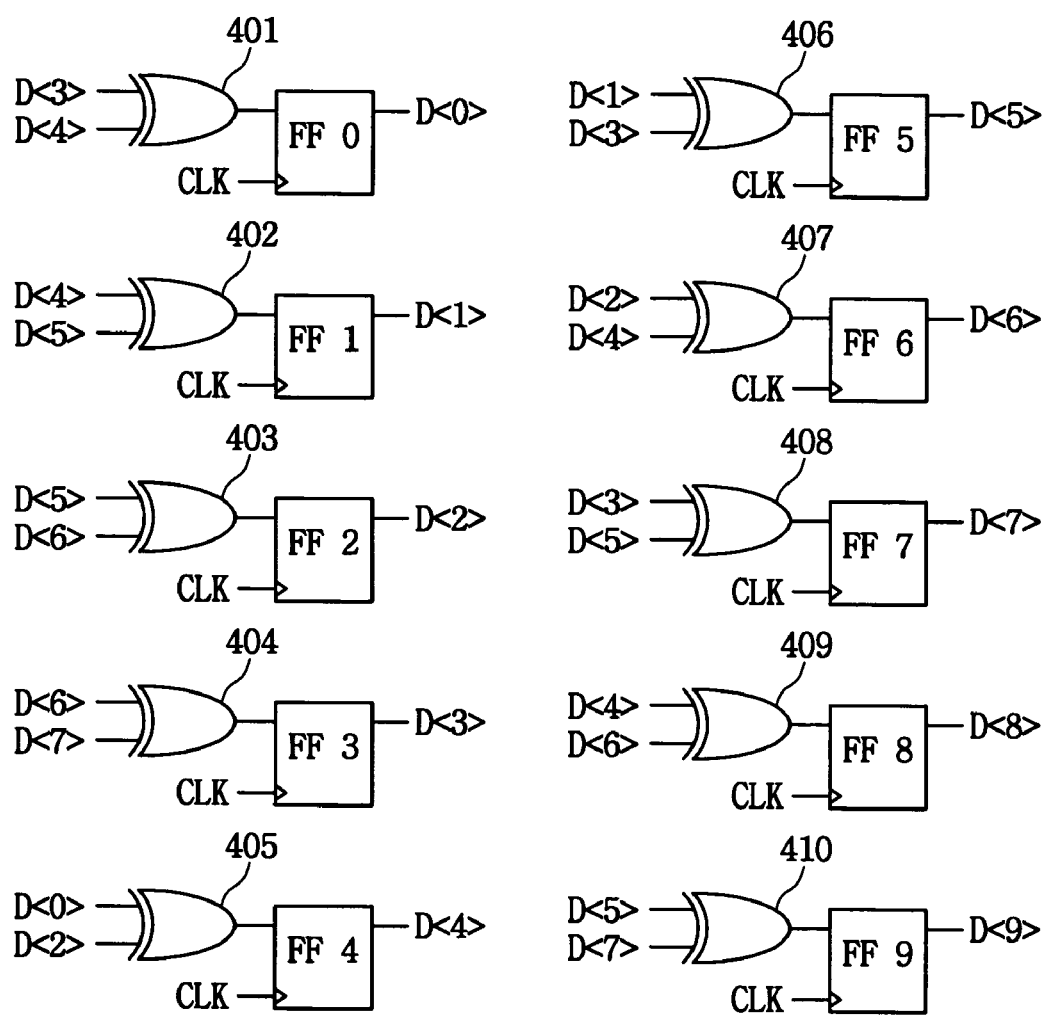
FIG. 6 is a circuit diagram showing in more detail an example implementation of a PRBS generator for use in the 8B/10B-like code generator of FIG. 5, according to an embodiment of the present invention.

FIG. 6 is a circuit diagram showing in more detail an example implementation of PRBS generator 400.

Referring to FIG. 6, it is assumed for the sake of example that PRBS generator 400 generates a 10 bit parallel PRBS. Accordingly, generator 400 includes 10 stages, each of which includes an XOR gate and a flip flop coupled to an output terminal of the XOR gate. In particular, PRBS generator 400 includes 10 flip flops (FF0, FF1, . . . , FF9) and 10 XOR gates (401, 402, . . . , 410). The various stages are feedback connected as depicted in the following Table 1.

TABLE 1

| Feedback Inputs to XOR | | Stage | | FF Output |
|---|---|---|---|---|
| | | XOR | FF | |
| D<3> | D<4> | 401 | 0 | D<0> |
| D<4> | D<5> | 402 | 1 | D<1> |
| D<5> | D<6> | 403 | 2 | D<2> |
| D<6> | D<7> | 404 | 3 | D<3> |
| D<0> | D<2> | 405 | 4 | D<4> |
| D<1> | D<3> | 406 | 5 | D<5> |
| D<2> | D<4> | 407 | 6 | D<6> |
| D<3> | D<5> | 408 | 7 | D<7> |
| D<4> | D<6> | 409 | 8 | D<8> |
| D<5> | D<7> | 410 | 9 | D<9> |

As a specific example from Table 1, the stage that includes XOR 406 and FF5 produces signal d<5> at the output of FF5 and has signals d<1> and d<3> at the inputs of XOR 406. The flip flops FF0 through FF9, respectively, should have an arbitrary initial non-zero value.

More generally, there are two types of feedback connections for the stages of PRBS generator 400. The first type of feedback connection, e.g., used by four of the stages, is as follows: for input A of the ith stage (hereafter, input<iA>), input<iA>=d<i+3>; and input<iB>=d<i+4>. The second type of feedback connection, e.g., used by six of the stages, is as follows for the jth stage: input<jA>=d<j−4>; and input<jB>=d<j−2>. Here, XOR gates 401–404 have the first type of feedback connection, while XOR gates 405–410 have the second type of feedback connection.

Figure 1:
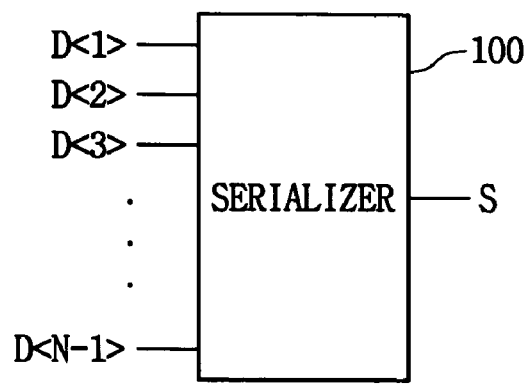
FIG. 1 is a schematic view of the Related Art showing a general n:1 serializer.
Figure 2:
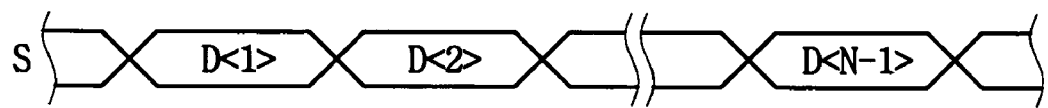
FIG. 2 is a schematic view of the Related Art showing a waveform of serialized data outputted from the n:1 serializer of FIG. 1.
Figure 3:
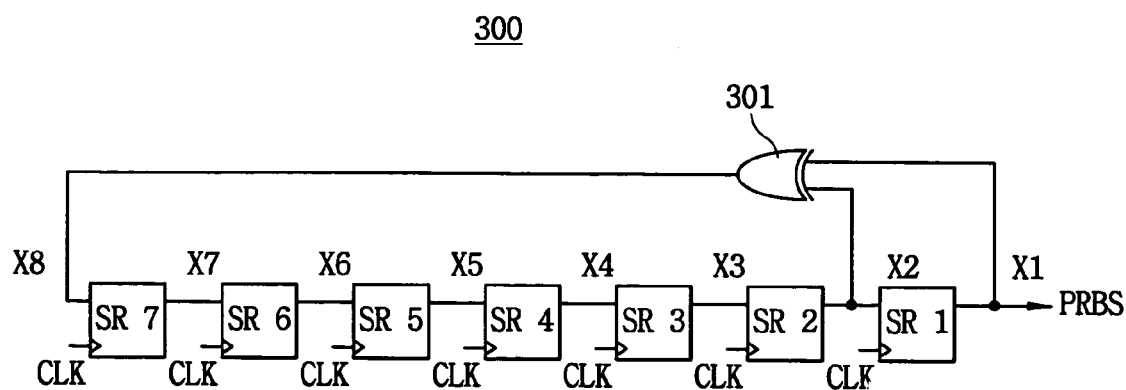
FIG. 3 is a schematic view of the Related Art showing a general PRBS generator.
Figure 4:
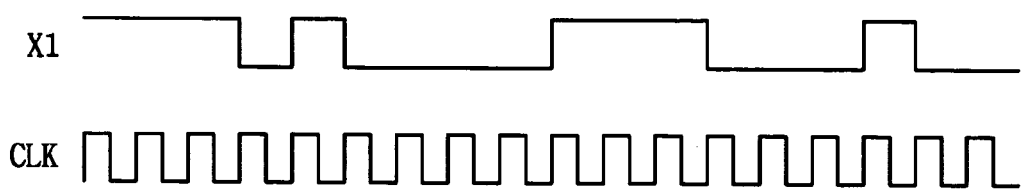
FIG. 4 is a timing diagram of the Related Art showing a X1 output of the PRBS generator of FIG. 3.

The frequency of the clock signal of FIG. 6 may be up to ten times smaller than the frequency of the clock signal of Related Art FIG. 3 since 10 bits of parallel PRBS data d<0:9>are substantially simultaneously (namely, in parallel) outputted from PRBS generator 400. Therefore, PRBS generator 400 may be implemented using a relatively low frequency clock signal compared with Related Art PRBS generator 100, which can reduce cost and/or ease implementation.

The 10 bit parallel PRBS generator may be implemented using a plurality of XOR gates and flip flops based on the function of the parallel PRBS generator 300 of FIG. 3.

Since $X8(n) = X1(n) \oplus X2(n)$ in the PRBS generator 300 of FIG. 3, $$X9(n) = X2(n) \oplus X3(n),$$

$$X10(n) = X3(n) \oplus X4(n),$$

$$X11(n) = X1(n+1) = X4(n) \oplus X5(n),$$

$$X12(n) = X2(n+1) = X5(n) \oplus X6(n),$$

$$X13(n) = X3(n+1) = X6(n) \oplus X7(n),$$

$$X14(n) = X4(n+1) = X7(n) \oplus X8(n),$$

$$\begin{aligned} X15(n) &= X5(n+1) \\ &= X8(n) \oplus X9(n) \\ &= [X1(n) \oplus X2(n)] \oplus [X2(n) \oplus X3(n)] \\ &= X1(n) \oplus X3(n), \end{aligned}$$

$$\begin{aligned} X16(n) &= X6(n+1) \\ &= X9(n) \oplus X10(n) \\ &= [X2(n) \oplus X3(n)] \oplus [X3(n) \oplus X4(n)] \\ &= X2(n) \oplus X4(n), \end{aligned}$$

$$\begin{aligned} X17(n) &= X7(n+1) \\ &= X10(n) \oplus X11(n) \\ &= [X3(n) \oplus X4(n)] \oplus [X4(n) \oplus X5(n)] \\ &= X3(n) \oplus X5(n), \end{aligned}$$

$$\begin{aligned} X18(n) &= X8(n+1) \\ &= X11(n) \oplus X12(n) \\ &= [X4(n) \oplus X5(n)] \oplus [X5(n) \oplus X6(n)] \\ &= X4(n) \oplus X6(n), \end{aligned}$$

$$\begin{aligned} X19(n) &= X9(n+1) \\ &= X12(n) \oplus X13(n) \\ &= [X5(n) \oplus X6(n)] \oplus [X6(n) \oplus X7(n)] \\ &= X5(n) \oplus X7(n), \end{aligned}$$

$$\begin{aligned} X20(n) &= X10(n+1) \\ &= X13(n) \oplus X14(n) \\ &= [X6(n) \oplus X7(n)] \oplus [X7(n) \oplus X8(n)] \\ &= X6(n) \oplus X8(n), \end{aligned}$$

wherein n denotes a present clock, and n+1 denotes a next clock.

X1 corresponds to d<0> of FIG. 6, X2 corresponds to d<1> of FIG. 6, X3 corresponds to d<2> of FIG. 6, X4 corresponds to d<3> of FIG. 6, X5 corresponds to d<4> of FIG. 6, X6 corresponds to d<5> of FIG. 6, X7 corresponds to d<6> of FIG. 6, X8 corresponds to d<7> of FIG. 6, X9 corresponds to d<8> of FIG. 6, and X10 corresponds to d<9> of FIG. 6.

Table 2 shows an example of 10 bit parallel PRBS data (namely, d<0:9>) output from the PRBS generator 400 of FIG. 6 and an output of an 8B/10B-like code generating section 600 of FIG. 5.

Referring to table 2, $2^7-1=127$ words are repeatedly outputted from the 8B/10B-like code generating section 600. One word has 10 bits. An initial value of d<0:6> is "0000010". Hereinafter, "_" is inserted between upper 6 bits and lower 4 bits since the 8B/10B code is divided into upper 6 bits and lower 4 bits.

TABLE 2

| output of PRBS generator 400 (d<0:9>) | output of 8B/10B-like code generating section 600 (enc<0:9>) |
|---|---|
| 000001_0000 | 000111_0101 |
| 011000_0101 | 111000_0101 |
| . | . |
| . | . |
| . | . |
| 000000_1000 | 100111_1000 |
| . | . |
| . | . |
| . | . |
| 101111_1110 | 001110_1110 |

As shown in the example of Table 2, there can be parallel bit sequences d<0:9> output from PRBS generator 400 that do not have four "0"s, five "0"s, or six "0"s among 10 bits of the parallel bit sequence d<0:9>. However, 8B/10B code generally has four "0"s, five "0"s, or six "0"s among 10 bits of 8B/10B code. In addition, the parallel bit sequence d<0:9> may have seven consecutive "1"s (for example, "101111_1110"), or six consecutive "0"s (for example, "000001_0000", "000000_1000"). The 8B/10B-like code generating section 600 restricts the number of consecutive "0"s or consecutive "1"s in each 10 bit word appearing in the parallel bit sequence to be in a range of 4 to 6, or alternatively restricts the number of consecutive "0"s or consecutive "1"s of each of the words to be 5 or fewer. In addition, the 8B/10B-like code generating section 600 restricts the number of consecutive "0"s or "1"s across two consecutive words to be 5 or fewer.

Figure 7:
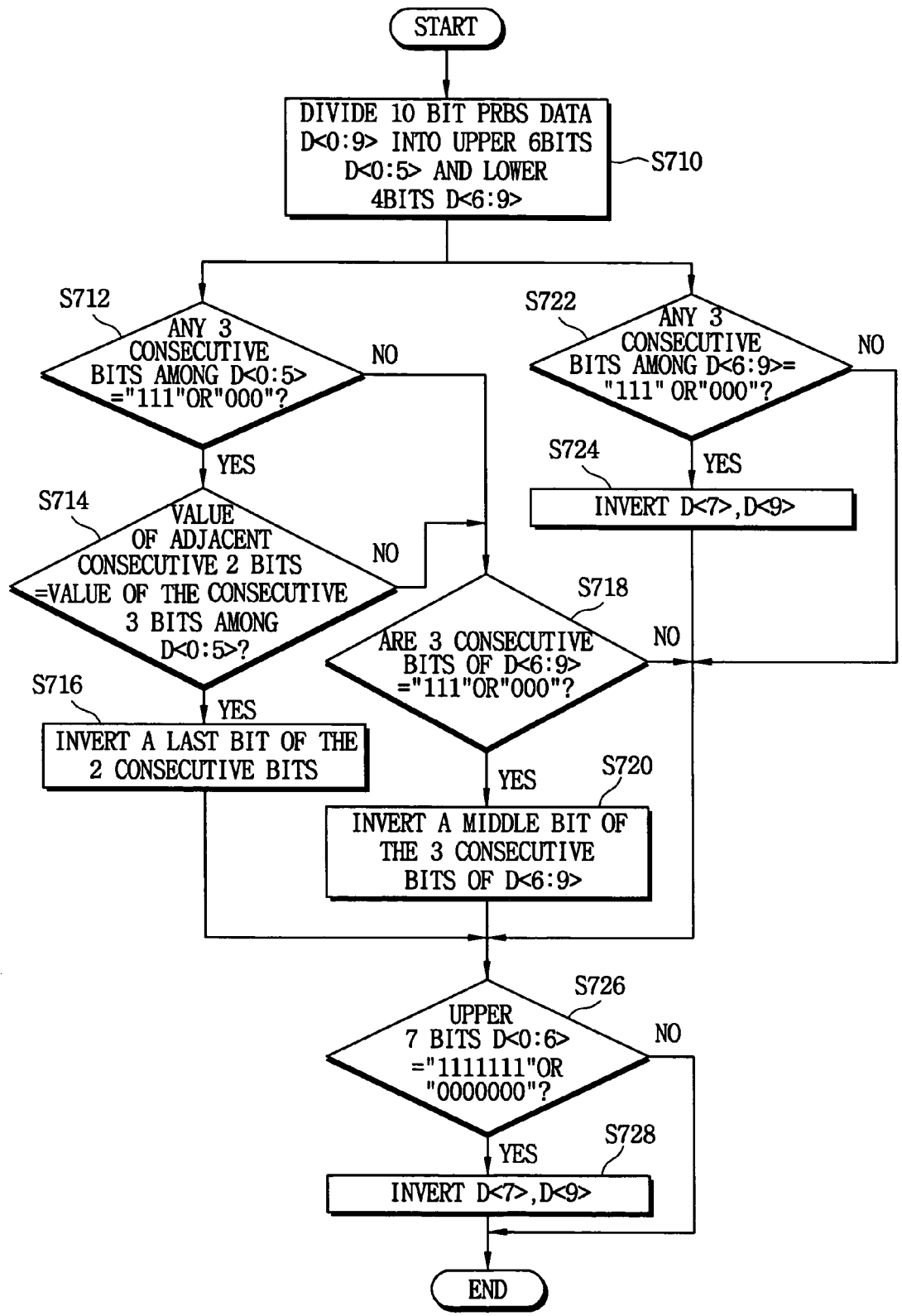
FIG. 7 is a flow chart showing a method of generating an 8B/10B-like code bit sequence according to an embodiment of the present invention.

FIG. 7 is a flow chart showing a method of generating an 8B/10B-like code bit sequence, according to an embodiment of the present invention.

Referring to FIG. 7, 10 bit parallel PRBS data d<0:9> is divided into the upper 6 bits d<0:5> and the lower 4 bits d<6:9> (step S710). Flow proceeds in parallel from step S710 to steps S712 and S722. Initially, step S712 will be discussed. Further below, step S722 will be discussed.

At step S722, it is judged whether any group of 3 consecutive bits (hereinafter, first consecutive data) among the upper 6 bits d<0:5>, for example d<0:2>, d<1:3>, d<2:4>, d<3:5>, d<4:5,0>, d<5, 0:1>, has the same binary value "111" or "000". Hereinafter, the notation d<4:5,0> denotes d<4>, d<5> and d<0>, and d<5, 0:1> denotes d<5>, d<0> and d<1>. Upper bits may be checked prior to lower bits. For example, d<0:2> may be checked prior to d<1:3>, d<2:4>, d<3:5>, d<4:5,0> and d<5, 0:1>, and d<1:3> may be checked prior to d<2:4>, d<3:5>, d<4:5,0> and d<5, 0:1>, and so on. When a group of bits d<0:2> has the same binary value "1" or "0", it is unnecessary to continue checking bits d<1:3>, d<2:4>, d<3:5>, d<4:5,0> and d<5, 0:1>. Alternatively, lower bits may be checked prior to upper bits. For example, d<5, 0:1> may be checked prior to d<0:2>, d<1:3>, d<2:4>, d<3:5> and d<4:5,0>, and d<4:5,0> may be checked prior to d<0:2>, d<2:4> and d<3:5>, and so on.

When any group of 3 consecutive bits of the upper 6 bits d<0:5> has the same binary value "111" or "000", it is then judged whether a different group of 2 consecutive bits (hereinafter, second consecutive data) has the same value as that of the first consecutive data. The second consecutive data are selected from bits adjacent to the first consecutive data or are selected from the other bits of the upper 6 bits d<0:5> (other than the first consecutive data). For example, when d<0:2> has the binary value "111" (or "000"), it is judged whether adjacent pairs of 2 consecutive bits d<2:3> and d<5:0> and adjacent pairs of 2 consecutive bits d<3:4> and d<4:5>, which are selected from the other bits d<3:5> of the upper 6 bits d<0:5> (other than the first consecutive data d<0:2>), have the binary value "11" (or "00") (step S714).

When the second consecutive data have the same binary value as that of the first consecutive data, the last bit of the matching second consecutive data is inverted (step S716). For example, the last bit of d<2:3> may be d<3>, and the last bit of d<5:0> may be d<0>. The other bits of the second consecutive data are not inverted. Alternatively, the first bit of the matching second consecutive data may be inverted instead of the last bit.

When the first consecutive data do not have the same binary value, or when the first consecutive data have the same binary value but the second consecutive data do not match the first consecutive data, step S718 is performed. In step S718, it is judged whether any group of 3 consecutive bits (hereinafter, third consecutive data) of the lower 4 bits d<6:9>, for example d<6:8>, d<7:9>, d<8:9,6> and d<9:6, 7>, have the same binary value "111" or "000". Hereinafter, the notation d<8:9,6> denotes d<8>, d<9> and d<6>, and d<9:6,7> denotes d<9>, d<6> and d<7>.

When the third consecutive data have the same binary value "111" or "000", a middle bit of the third consecutive data is inverted (step S720). For example, d<6> and d<8> are inverted when the lower 4 bits d<6:9> does not have the same binary value "1111" nor "0000", and d<7> and d<9> are inverted regardless of the values of the lower 4 bits d<6:9>. When the third consecutive data have the same binary value "111" or "000", the first or last bit of the third consecutive data may be inverted instead of the middle bit of the third consecutive data.

As noted above, flow proceeds in parallel from step S710 to steps S712 and S722. At step S722, it is judged whether the upper 4 bits d<6:9> have the same binary value "1111" or "0000". When the upper 4 bits d<6:9> have the same binary value "1111" or "0000", then d<7> and d<9> are inverted (step S724). Alternatively, d<7> and d<8> may be inverted instead of d<7> and d<9>.

When the upper 4 bits d<6:9> do not have the same binary value "1111" nor "0000", then step S726 is performed. In step S726, it is determined whether upper 7 bits d<0:6> of 10 bits PRBS data d<0:9> have the same binary value "1111111" or "0000000". When the upper 7 bits d<0:6> have the same binary value "1111111" or "0000000", then d<7> and d<9> are inverted (step S728). Alternatively, d<7> and d<8> may be inverted instead of d<7> and d<9>.

Hereinafter, the method of generating the 8B/10B-like code bit sequence is described with reference to the following examples. Consider a first example (Example 1).

Example 1

| d⟨0⟩ | d⟨1⟩ | d⟨2⟩ | d⟨3⟩ | d⟨4⟩ | d⟨5⟩ | d⟨6⟩ | d⟨7⟩ | d⟨8⟩ | d⟨9⟩ |
|---|---|---|---|---|---|---|---|---|---|
| 0 | 0 | 0 | 1 | 0 | 0 | 0 | 0 | 0 | 0. |

In Example 1, the bits d<0:2> of upper 6 bits d<0:5> have the same binary value "000", the 2 consecutive bits d<2:3> adjacent to d<0:2> do not have the same binary value (namely not "00" nor "11"), and the 2 consecutive bits d<3:4> of the other bits (d<3>, d<4>, d<5>) of the upper 6 bits d<0:5> (other than d<0:2>) do not have the same binary value. Since bits d<4:5> and d<5,0>, respectively, have "00", then the last bits d<5> and d<0> of each of d<4:5> and d<5,0> are inverted, and thus the following parallel bit sequence is provided as a result.

| enc⟨0⟩ | enc⟨1⟩ | enc⟨2⟩ | enc⟨3⟩ | enc⟨4⟩ | enc⟨5⟩ |
|---|---|---|---|---|---|
| 1 | 0 | 0 | 1 | 0 | 1 |

Since the lower 4 bits d<6:9> in Example 1 have "0000", then bits d<7> and d<9> are inverted, and thus the following parallel bit sequence is provided as a result.

| enc⟨0⟩ | enc⟨1⟩ | enc⟨2⟩ | enc⟨3⟩ | enc⟨4⟩ | enc⟨5⟩ | enc⟨6⟩ | enc⟨7⟩ | enc⟨8⟩ | enc⟨9⟩ |
|---|---|---|---|---|---|---|---|---|---|
| 0 | 1 | 1 | 0 | 1 | 0 | 1 | 1 | 0 | 1 |

Consider a second example (Example 2).

Example 2

| d⟨0⟩ | d⟨1⟩ | d⟨2⟩ | d⟨3⟩ | d⟨4⟩ | d⟨5⟩ | d⟨6⟩ | d⟨7⟩ | d⟨8⟩ | d⟨9⟩ |
|---|---|---|---|---|---|---|---|---|---|
| 0 | 1 | 1 | 0 | 1 | 0 | 1 | 1 | 0 | 1 |

In Example 2, since there is no group of 3 consecutive bits of the upper (bits d<0:5>) which take the pattern "111" or "000", and no group of 3 consecutive bits of the lower 4 bits d<6:9> have the binary value "111", then the middle bit d<6> of the consecutive bits d<5:7> is inverted, and thus the following parallel bit sequence is provided as a result.

| enc⟨0⟩ | enc⟨1⟩ | enc⟨2⟩ | enc⟨3⟩ | enc⟨4⟩ | enc⟨5⟩ | enc⟨6⟩ | enc⟨7⟩ | enc⟨8⟩ | enc⟨9⟩ |
|---|---|---|---|---|---|---|---|---|---|
| 0 | 1 | 1 | 0 | 1 | 0 | 0 | 1 | 0 | 1 |

Figure 8:
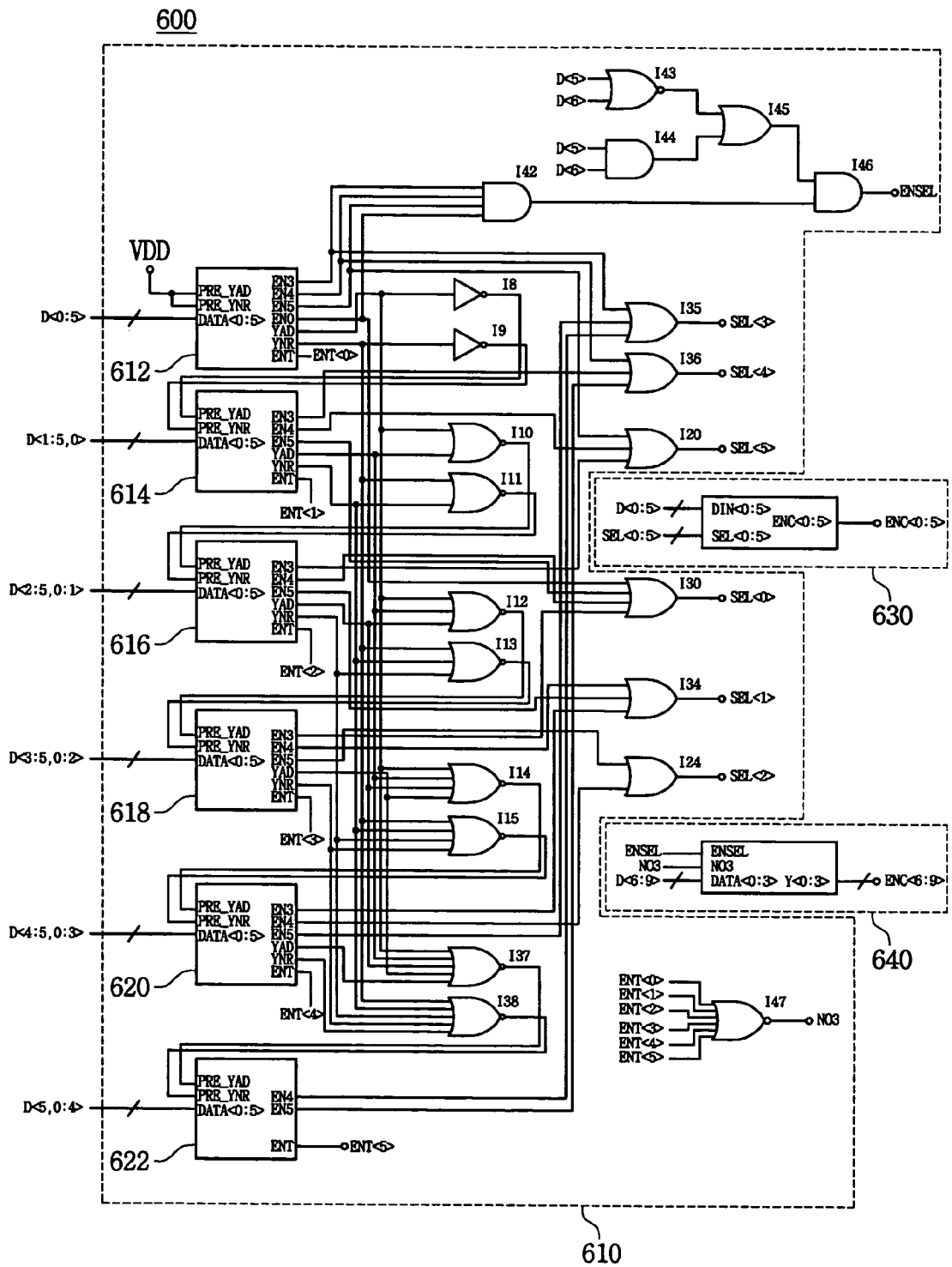
FIG. 8 is a circuit diagram showing in more detail an example implementation of the 8B/10B-like code generating section of FIG. 5, according to an embodiment of the present invention.

FIG. 8 is a circuit diagram showing in more detail an example implementation of 8B/10B-like code generating section 600 of FIG. 5, according to an embodiment of the present invention.

Referring to FIG. 8, an 8B/10B-like code generating section 600 includes a transforming section 610, a first inverting section 630 and a second inverting section 640. Transforming section 610 includes first, second, third, fourth, fifth and sixth detecting sections 612, 614, 616, 618, 620 and 622.

Transforming section 610 receives 10 bit parallel PRBS data d<0:9>, judges whether any group of 3 consecutive bits (namely, the first consecutive data) of the upper 6 bits d<0:5> has (have) the same first binary value, and judges whether a different group of 2 consecutive bits (namely, the second consecutive data) of the upper 6 bits d<0:5> has (have) the same binary value. In addition, transforming section 610 judges whether the upper 7 bits d<0:6> of bits d<0:9> have the same binary value such as "1111111" or "0000000"so that a number of consecutive "0"s or "1"s of the d<0:9> is less than or equal to M1. M1 is a natural number less than N, and N is the number of bits of the 8B/10B code. For example, M1 is 5 when N is 10.

A terminal pre_yad, which is an input terminal of detecting sections 612, 614, 616, 618, 620 and 622, respectively, receives a signal that represents one of the outputs provided by the previous detecting section regardless of whether or not 3 consecutive bits have the binary value "111". Another terminal pre_ynr, which is another input terminal of detecting sections 612, 614, 616, 618, 620 and 622, respectively, receives a signal that represents another of the outputs provided by the previous detecting section regardless of whether or not 3 consecutive bits have the binary value "000".

A terminal yad, which is an output terminal of detecting sections 612, 614, 616, 618, 620 and 622, respectively, provides a signal that represents one of the outputs of the present detecting section regardless of whether or not 3 consecutive bits have the binary value "111". Another terminal ynr, which is another output terminal of detecting sections 612, 614, 616, 618, 620 and 622, respectively, provides a signal that represents one of the outputs of the present detecting section regardless of whether or not 3 consecutive bits have the binary value "000".

First detecting section 612, when signals pre_yad and pre_ynr respectively have logic "1", receives bits d<0>, d<1>, d<2>, d<3>, d<4> and d<5> (hereinafter, d<0:5>) of the 10 bit parallel PRBS data d<0:9> via input terminals data<0>, data<1>, data<2>, data<3>, data<4> and data<5> (hereinafter, data<0:5>), judges whether d<0>, bits d<1> and d<2> (hereinafter, d<0:2>) have the same binary value, and outputs signal ent<0> that represents whether or not bits d<0:2> have the same binary value via an output terminal ent. For example, if bits d<0:2> have the same binary value, then signal ent<0> has logic "1".

Second detecting section 614 receives bits d<1>, d<2>, d<3>, d<4>, d<5>and d<0> (hereinafter, d<1:5,0>) via input terminals data<0:5>, judges whether bits d<1>, d<2> and d<3> (hereinafter, d<1:3>) have the same binary value, and outputs signal ent<1> that represents whether or not bits d<1:3> have the same binary value via an output terminal ent. For example, if bits d<1:3> have the same binary value, then signal ent<1> has logic "1".

Third detecting section 616 receives bits d<2>, d<3>, d<4>, d<5>, d<0> and d<1> (hereinafter, d<2:5,0:1>) via input terminals data<0:5>, judges whether bits d<2>, d<3> and d<4> (hereinafter, d<2:4>) have the same binary value, and outputs signal ent<2> that represents whether or not bits d<2:4> have the same binary value via an output terminal ent. For example, if bits d<2:4> have the same binary value, then signal ent<2> has logic "1".

Fourth detecting section 618 receives bits d<3>, d<4>, d<5>, d<0>, d<1> and d<2> (hereinafter, d<3:5,0:2>) via input terminals data<0:5>, judges whether bits d<3>, d<4> and d<5> (hereinafter, d<3:5>) have the same binary value, and outputs signal ent<3> that represents whether or not bits d<3:5> have the same binary value via an output terminal ent. For example, if bits d<3:5> have the same binary value, then signal ent<3> has logic "1".

Fifth detecting section 620 receives bits d<4>, d<5>, d<0>, d<1>, d<2> and d<3> (hereinafter, d<4:5,0:3>) via input terminals data<0:5>, judges whether bits d<4>, d<5> and d<0> (hereinafter, d<4:5,0>) have the same binary value, and outputs signal ent<4> that represents whether or not bits d<4:5,0> have the same binary value via an output terminal ent. For example, if bits d<4:5,0> have the same binary value, then signal ent<4> has logic "1".

Sixth detecting section 622 receives bits d<5>, d<0>, d<1>, d<2>, d<3> and d<4> (hereinafter, d<5,0:4>) via input terminals data<0:5>, judges whether bits d<5>, d<0> and d<1> (hereinafter, d<5, 0:1>) have the same binary value, and outputs signal ent<5> that represents whether or not bits d<5, 0:1> have the same binary value via an output terminal ent. For example, if bits d<5, 0:1> have the same binary value, then signal ent<5> has logic "1".

Inverters I8 and I9 and NOR gates I10, I11, I12, I13, I14, I15, I37 and I38 provide, respectively, signals to terminals pre_yad and pre_ynr of the next detecting section based upon outputs from the present detecting section for 3 bits selected from the upper 6 bits of the 10 bit parallel PRBS data d<0:9>.

In particular, inverter I8 receives a signal from output terminal yad, and outputs logic value "1" to terminal pre_yad of second detecting section 614 when bits d<0:2> do not have the binary value "111".

Inverter I9 receives a signal from output terminal ynr, and outputs logic value "1" to the terminal pre_ynr of second detecting section 614 when bits d<0:2> do not have the binary value "000".

Output terminals yad and ynr of first detecting section 612 represent that bits d<0:2> have the binary value "111" or "000", and output terminals yad and ynr of second detecting section 614 represent that bits d<1:3> have the binary value "111" or "000".

NOR gate I10 outputs logic value "1" to terminal pre_yad of third detecting section 616 when bits d<0:2> and d<1:3>, respectively, do not have the binary value "111". The output of NOR gate 110 is provided to input terminal pre_yad of third detecting section 616. If the signal on terminal pre_yad is "1", then third detecting section 616 checks whether bits d<2:5> include the sequence "111" of binary values.

NOR gate I11 outputs logic value "1" to terminal pre_ynr of third detecting section 616 when bits d<0:2> and d<1:3>, respectively, do not have the binary value "000". The output of NOR gate I11 is provided to input terminal pre_ynr of third detecting section 616. If the signal on terminal pre_yrn is "1", then third detecting section 616 checks whether bits d<2:5> include the sequence "000" of binary values.

NOR gate I12 outputs logic value "1" to terminal pre_yad of fourth detecting section 618 when bits d<0:2>, d<1:3> and d<2:4>, respectively, do not have the binary value "111". The output of NOR gate I12 is provided to input terminal pre_yad of fourth detecting section 618.

NOR gate I13 outputs logic value "1" to terminal pre_ynr of fourth detecting section 618 when bits d<0:2>, d<1:3> and d<2:4>, respectively, do not have the binary value "000". The output of NOR gate I13 is provided to input terminal pre_ynr of fourth detecting section 618.

NOR gate I14 outputs logic value "1" to terminal pre_yad of fifth detecting section 620 when bits d<0:2>, d<1:3>, d<2:4> and d<3:5>, respectively, do not have the binary value "111". The output of NOR gate I14 is provided to input terminal pre_yad of fifth detecting section 620.

NOR gate I15 a outputs logic "1" to terminal pre_ynr of fifth detecting section 620 when bits d<0:2>, d<1:3>, d<2:4> and d<3:5>, respectively, do not have the binary value "000". The output of NOR gate I15 is provided to input terminal pre_ynr of fifth detecting section 620.

NOR gate I37 outputs a logic "1" to terminal pre_yad of sixth detecting section 622 when bits d<0:2>, d<1:3>, d<2:4>, d<3:5> and d<4:5,0>, respectively, do not have the binary value "111". The output of NOR gate I37 is provided to input terminal pre_yad of sixth detecting section 622.

NOR gate I38 outputs logic value "1" to terminal pre_ynr of sixth detecting section 622 when bits d<0:2>, d<1:3>, d<2:4>, d<3:5> and d<4:5,0>, respectively, do not have the binary value "000". The output of NOR gate I38 is provided to input terminal pre_ynr of sixth detecting section 622.

An OR gate I35 outputs an inversion enable signal sel<3> having logic value "1" when bit d<3> satisfies one of three conditions in which bit d<3> may be inverted. In particular, OR gate I35 outputs inversion enable signal sel<3> having logic value "1" when one of the following is true: i) 3 consecutive bits d<0:2> have the same binary value, and 2 consecutive bits d<2:3> have the same binary value as that of the 3 consecutive bits d<0:2>; or ii) 3 consecutive bits d<4:5,0> have the same binary value, and 2 consecutive bits d<2:3> have the same binary value as that of the 3 consecutive bits d<4:5,0>; or iii) 3 consecutive bits d<5,0:1> have the same binary value, and 2 consecutive bits d<2:3> have the same binary value as that of the 3 consecutive bits d<5,0:1>.

In a similar way, OR gates I36, I20, I30, I34 and I24, respectively, output inversion enable signals sel<4>, sel<5>, sel<0>, sel<1> and sel<2> that each assume logic value "1" when bits d<4>, d<5>, d<0>, d<1> and d<2>, respectively, satisfy one of three corresponding conditions (relative to the 3 conditions mentioned above) in which bits d<4>, d<5>, d<0>, d<1> and d<2>, respectively, may be inverted.

A NOR gate I47 outputs a signal no3 having logic value "1" to second inverting section 640 when bits d<0:5> do not include 3 consecutive bits having the same binary value, or when bits d<0:5> include 3 consecutive bits having the same binary value but a different group of 2 consecutive bits (namely, the second consecutive data) does not have the same binary value as that of the 3 consecutive bits among bits d<0:5>.

AND gate I42, NOR gate I43, AND gate I44, OR gate I45 and AND gate I46 together check whether bits d<0:6> have the same binary value. AND gate I46 outputs a signal ensel to second inverting section 640. Signal ensel takes value "1" when bits d<0:6> have the same binary value such as "1111111" or "0000000".

First inverting section 630 receives the upper 6 bits d<0:5> via input terminal din<0:5> and determines whether each of the bits d<0:5> should be inverted or not. Second inverting section 640 receives the lower 4 bits d<6:9> via input terminal data<0:3> and determines whether each of the bits d<6:9> should be inverted or not.

Figure 9:
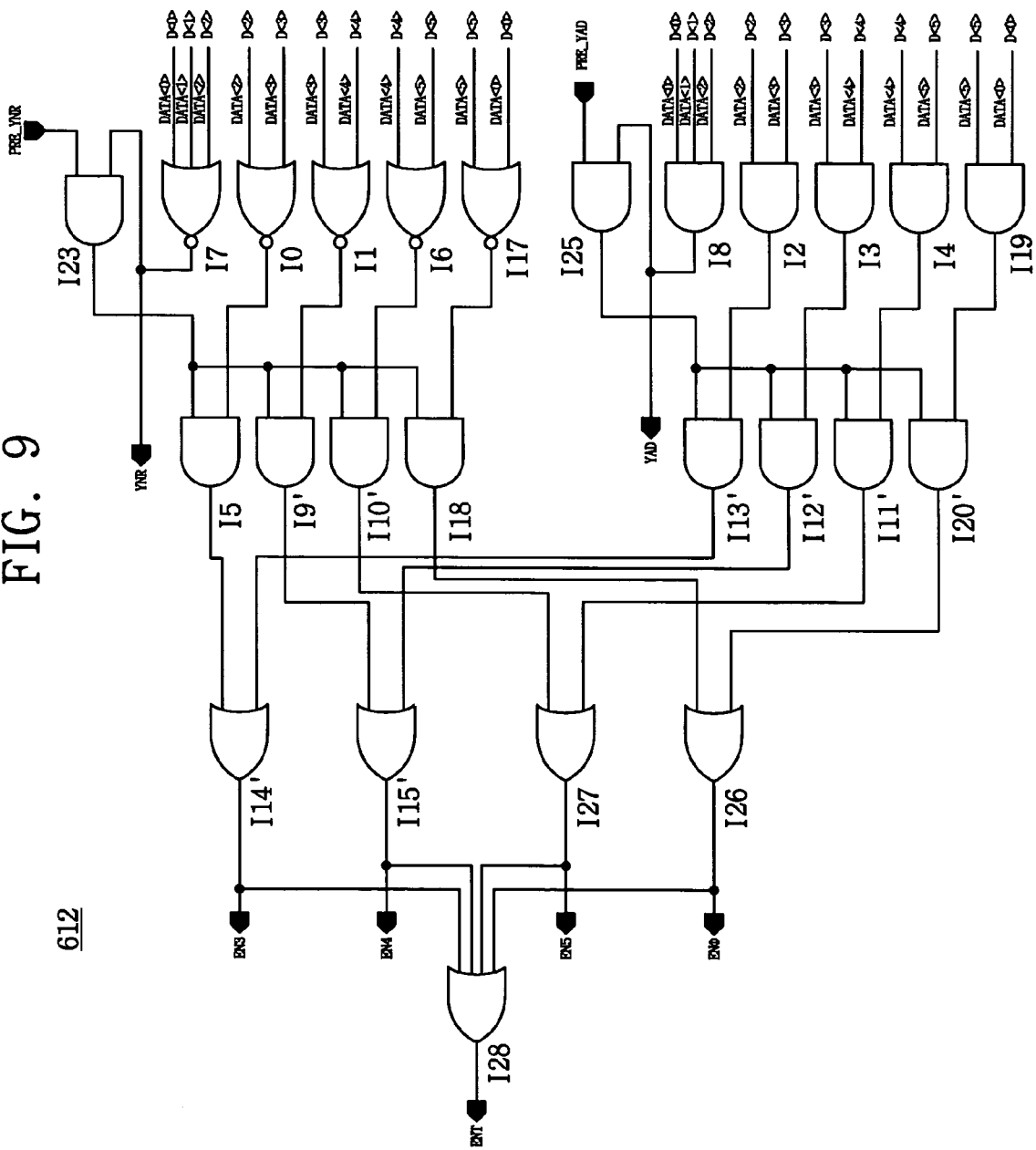
FIG. 9 is a circuit diagram according to an embodiment of the present invention showing in more detail an implementation of a first detecting section of FIG. 8.

FIG. 9 is a circuit diagram showing in more detail an implementation of first detecting section 612 of FIG. 8, according to an embodiment of the present invention.

Referring to FIG. 9, NOR gate I7 outputs logic value "1" when bits d<0:2> have the binary value "000", and AND gate I8 outputs logic value "1" when bits d<0:2> have binary value "111".

NOR gates I0, I1, I6 and I17 check whether any group of 2 consecutive bits such as bits d<2:3>, d<3:4>, d<4:5> and d<5:0>, respectively, have the binary value "00" when bits d<0:2> have the binary value "000".

NOR gates I2, I3, I4 and I19 check whether any group of 2 consecutive bits such as bits d<2:3>, d<3:4>, d<4:5> and d<5:0>, respectively, have the binary value "11" when bits d<0:2> have the binary value "111".

AND gates I5, I9', I10' and I18 check whether bits d<0:2> have the binary value "000" and any group of 2 consecutive bits such as bits d<2:3>, d<3:4>, d<4:5>and d<5:0>, respectively, have the binary value "00".

AND gates I13', I12', I11' and I20' check whether bits d<0:2> have the binary value "111" and any group of 2 consecutive bits such as bits d<2:3>, d<3:4>, d<4:5>and d<5:0>, respectively, have the binary value "11".

OR gate I14' outputs logic "1" as an inversion enable signal en3 for inverting the last bit d<3> of bits d<2:3> when bits d<0:2> have the same binary value such as "000" or "111" and 2 consecutive bits d<2:3> have the same binary value as that of the bits d<0:2>.

OR gate I15' outputs logic value "1" as an inversion enable signal en4 for inverting the last bit d<4> of bits d<3:4> when bits d<0:2> have the same binary value such as "000" or "111" and 2 consecutive bits d<3:4> have the same binary value as that of the bits d<0:2>.

OR gate I27 outputs logic value "1" as an inversion enable signal en5 for inverting the last bit d<5> of bits d<4:5> when bits d<0:2> have the same binary value such as "000" or "111" and 2 consecutive bits d<4:5> have the same binary value as that of bits d<0:2>.

OR gate I26 outputs logic value "1" as an inversion enable signal en0 for inverting the last bit d<0> of bits d<5,0> when bits d<0:2> have the same binary value such as "000" or "111" and 2 consecutive bits d<5,0> have the same binary value as that of bits d<0:2>.

AND gate I23 outputs logic value "1" when bits d<0:2> have the binary value "000" and signal pre_ynr has logic value "1". AND gate I25 outputs logic value "1" when bits d<0:2> have the binary value "111" and signal pre_yad has logic value "1".

OR gate I28 checks whether any 3 consecutive bits (namely, the first consecutive data) have the same binary value or whether any 2 different consecutive bits (namely, the second consecutive data) have the same binary value as that of the three consecutive bits (namely, the first consecutive data) when 3 consecutive bits have the same binary value. If so, then OR gate I28 outputs logic value "1" via output terminal ent. The signal output from OR gate I28 is used for determining whether or not the lower 4 bits d<6:9> should be inverted.

Figure 10:
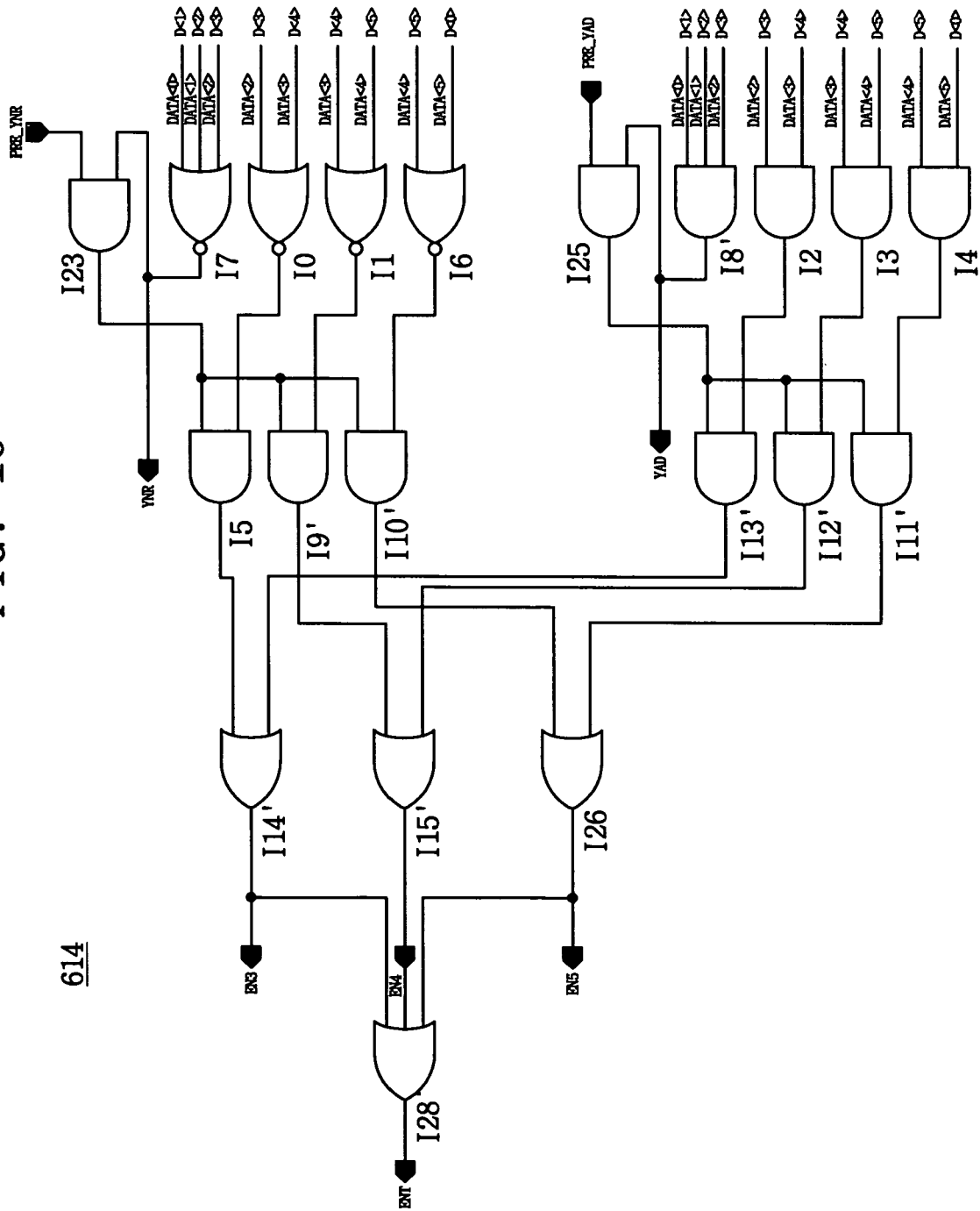
FIG. 10 is a circuit diagram according to an embodiment of the present invention showing in more detail an implementation of a second detecting section of FIG. 8.

FIG. 10 is a circuit diagram showing in more detail an implementation of second detecting section 614 of FIG. 8, according to an embodiment of the present invention.

Second detecting section 614 checks the binary values of three groups of 2 consecutive bits d<3:4>, d<4:5> and d<5,0> while first detecting section 612 checks the binary value of four groups of 2 consecutive bits d<2:3>, d<3:4>, d<4:5> and d<5,0>.

OR gate I28' checks whether any 3 consecutive bits (namely, the first consecutive data) have the same binary value or whether any different group of 2 consecutive bits (namely, the second consecutive data) have the same binary value as that of the 3 consecutive bits (namely, the first consecutive data) when the 3 consecutive bits have the same binary value. If so, then OR gate I28' outputs logic value "1" via the output terminal ent.

Figure 11:
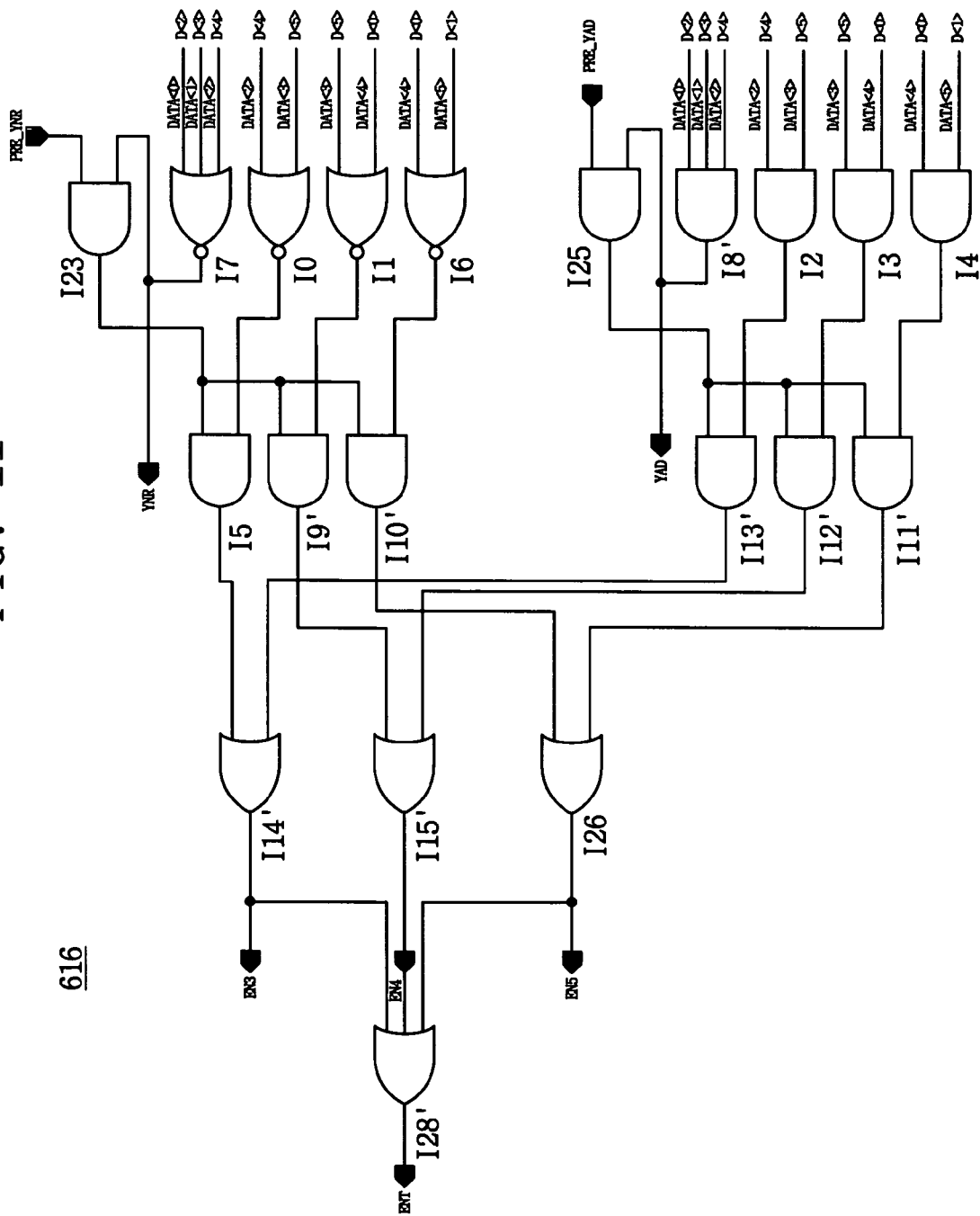
FIG. 11 is a circuit diagram according to an embodiment of the present invention showing in more detail an implementation of a third detecting section of FIG. 8.

FIG. 11 is a circuit diagram showing in more detail an implementation of third detecting section 616 of FIG. 8, according to an embodiment of the present invention.

Third detecting section 616 checks the binary values of three groups of 2 consecutive bits d<4:5>, d<5,0> and d<0:1> in a manner similar to detecting sections 612 and 614.

Figure 12:
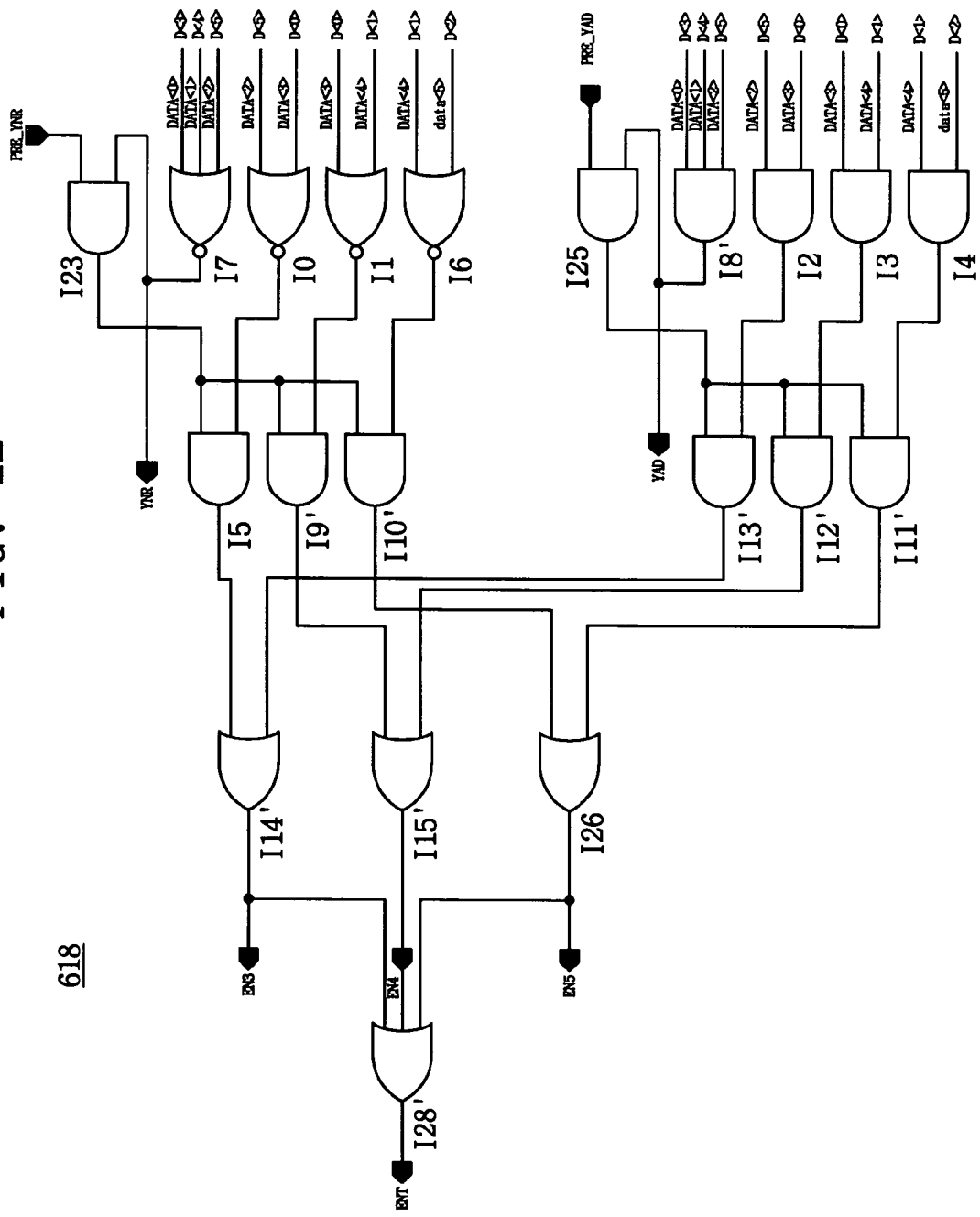
FIG. 12 is a circuit diagram according to an embodiment of the present invention showing in more detail an implementation of a fourth detecting section of FIG. 8.

FIG. 12 is a circuit diagram showing in more detail an implementation of fourth detecting section 618 of FIG. 8, according to an embodiment of the present invention.

Fourth detecting section 618 checks the binary values of three groups of 2 consecutive bits d<5,0>, d<0:1> and d<1:2> in a manner similar to detecting sections 612 and 614.

Figure 13:
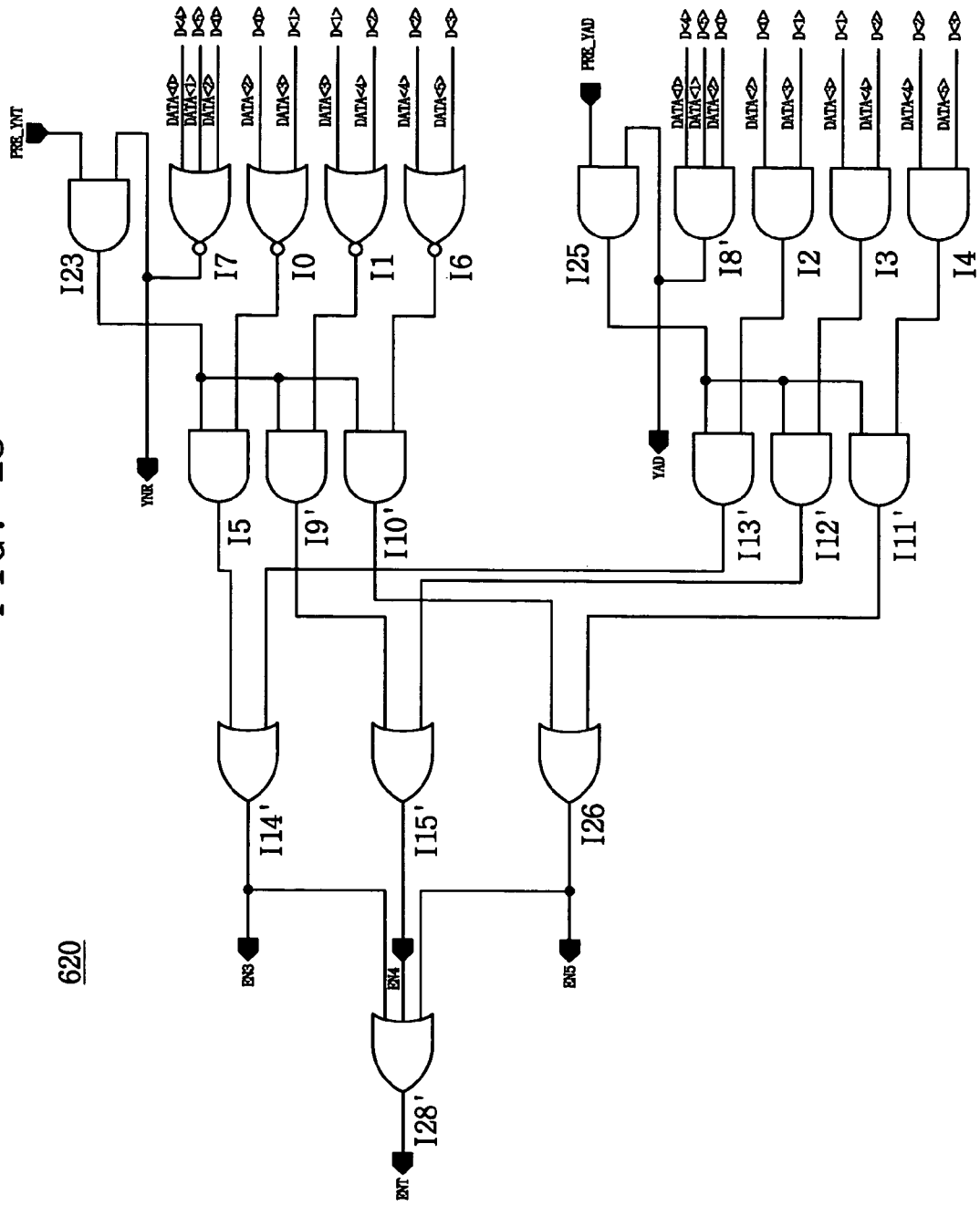
FIG. 13 is a circuit diagram according to an embodiment of the present invention showing in more detail an implementation of a fifth detecting section of FIG. 8.

FIG. 13 is a circuit diagram showing in more detail in implementation of fifth detecting section 620 of FIG. 8, according to an embodiment of the present invention.

Fifth detecting section 620 checks the binary values of three groups of 2 consecutive bits d<0:1>, d<1:2> and d<2:3> in a manner similar to detecting sections 612 and 614.

Figure 14:
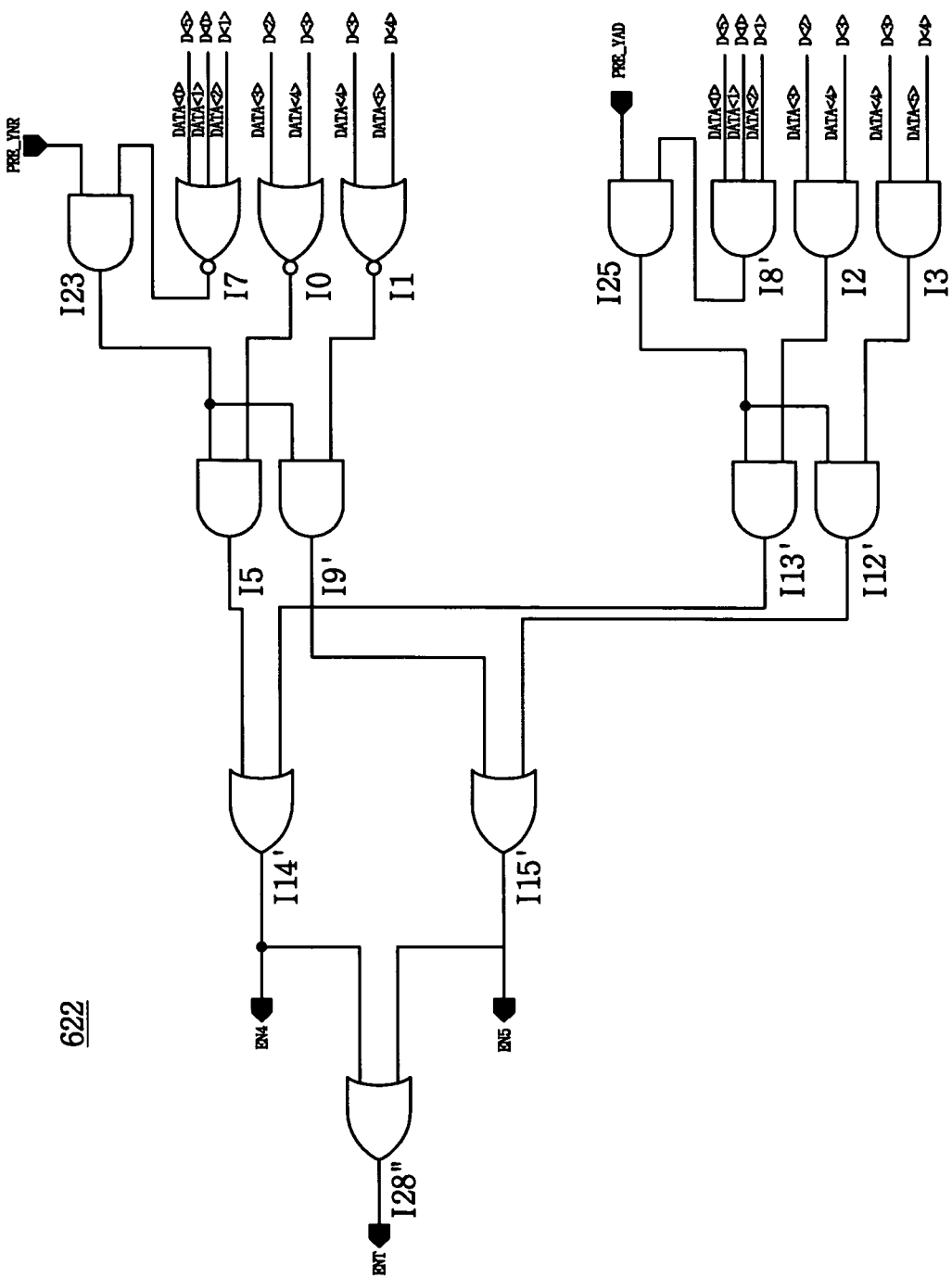
FIG. 14 is a circuit diagram according to an embodiment of the present invention showing in more detail an implementation of a sixth detecting section of FIG. 8.

FIG. 14 is a circuit diagram showing in more detail an implementation of sixth detecting section 622 of FIG. 8, according to an embodiment of the present invention.

Sixth detecting section 622 checks the binary values of two groups of 2 consecutive bits d<2:3> and d<3:4> while the second, third, fourth and fifth detecting sections 614, 616, 618 and 620 check the binary value of three groups of 2 consecutive bits. Otherwise, sixth detecting section 622 is similar to detecting sections 612 and 614.

FIG. 15 is a circuit diagram showing in more detail an implementation of first inverting section 630 of FIG. 8, according to an embodiment of the present invention.

First inverting section 630 includes a plurality of multiplexers (MUXs) I6, I7', I9", I13", I12" and I11". First inverting section 630 receives the upper 6 bits d<0:5> via input terminals din<0:5> and determines whether each of the bits d<0:5> should be inverted or not based on inversion enable signals sel<0:5>, respectively.

For example, output signal enc<0> of mux 16 has an inverted value of bit d<0>(namely $\overline{d<0>}$) when signal sel<0> has logic value "1"; and output signal enc<1> of mux 17' has an inverted value of bit d<1> (namely $\overline{d<1>}$) when signal sel<1> has logic value "1".

Output signals enc<2>, enc<3>, enc<4> and enc<5> of I9", I13", I12" and I11" have inverted bit values $\overline{d<2>}$, $\overline{d<3>}$, $\overline{d<4>}$ and $\overline{d<5>}$, respectively, when corresponding signals sel<2>, sel<3>, sel<4> or sel<5> have logic value "1", respectively.

FIG. 16 is a circuit diagram showing in more detail an implementation of second inverting section 640 of FIG. 8, according to an embodiment of the present invention.

NOR gate I40, AND gate I41, OR gates I43 and I47 together form output signal sel_inv that has logic value "1" when the lower 4 bits d<6:9> have the same binary value "0000" or "1111". When signal sel_inv has logic value "1", OR gates I26' and I32 invert the second and fourth bits d<7> and d<9> of the lower 4 bits d<6:9>, but AND gates I33 and I34' do not invert the first and third bits d<6> and d<8> of the lower 4 bits d<6:9>.

A signal no3 outputted from NOR gate I47 has logic value "1" when the upper 6 bits d<0:5> do not include any 3 consecutive bits (namely, the first consecutive data) having the same binary value, or when bits d<0:5> include any 3 consecutive bits (the first consecutive data) having the same binary value but no other different group of 2 consecutive bits (namely, the second consecutive data) has the same binary value as that of the 3 consecutive bits (namely, the first consecutive data).

NOR gates I8''', I11", I12" and I19, AND gates I13", I14", I15" and I20' receive d<6>, d<7>, d<8> and d<9> via input terminals data<0>, data<1>, data<2> and data<3>, respectively, and together and check whether any group of 3 consecutive bits (namely, the third consecutive data) of the lower 4 bits d<6:9> have the binary value such as "111" or "000". If so, then OR gates I16', I17', I18 and I21 together output inversion enable signals sel<1>, sel<2>, sel<3> and sel<0> to invert the middle bit of the 3 consecutive bits (namely, the third consecutive data) of the lower 4 bits d<6:9>. In particular, bits d<6>, d<7>, d<8> and d<9> are inverted in response to inversion enable signals sel<1>, sel<2>, sel<3> and sel<0>, respectively.

For example, NOR gate I8''' receives bits d<6:8> via input terminals data<0:2>, and outputs logic value "1" when bits d<6:8> have the binary value "000". AND gate I13" receives bits d<6:8> via input terminals data<0:2>, and outputs logic value "1" when bits d<6:8> have the binary value "111".

OR gate I16' outputs inversion enable signal sel<1> having logic value "1" and inverts bit d<7> when bits d<6:8> have the binary value "000" or "111". In particular, OR gate I26' outputs logic value "1" when signal sel_inv has logic value "0", sel<1> has logic value "1" and no3 has logic value "1", and multiplexer I9" outputs the inverted value of bit d<7> (the middle bit of d<6:8>), or $\overline{d<7>}$, via output terminal y<1>.

When the upper 7 bits of 10 bit parallel PRBS data have the same binary value such as "1111111" or "0000000", since signal ensel has logic value "1", signal sel_inv has logic value "1"so as to cause inversion of the second (d<7) and fourth (d<9>) bits of the lower 4 bits d<6:9>.

While the example embodiments of the present invention and its advantages have been described in detail, it should be understood that various changes, substitutions and alterations can be made herein without departing from the scope of the invention.

What is claimed is:

1. A method of generating an N-bit sequence, from a generated parallel pseudo random N-bit sequence, comprising:
   generating a parallel pseudo random bit sequence having N bits wherein N is an integer and N≧2; and
   transforming the parallel pseudo random bit sequence into a parallel first bit sequence, having a number Q of consecutive "0"s or "1"s of the first bit sequence being Q≦M1, wherein Q and M1 are integers and M1<N, including inverting at least one bit of the N bits of the pseudo random bit sequence to generate the first bit sequence.

2. The method of claim 1, further comprising providing the first bit sequence as an input to a serializer.

3. The method of claim 1, further comprising transforming the first bit sequence into a parallel second bit sequence, a number R of "0"s or "1"s of the second bit sequence being R≦M2, wherein R and M2 are integers and M2<N.

4. The method of claim 1, wherein said transforming of the pseudo random bit sequence includes:
   dividing the pseudo random bit sequence into a parallel first pseudo random bit sub-sequence having N1 bits and a parallel second pseudo random bit sub-sequence having N2 bits wherein N1 and N2 are integers and N1<N, N2<N and N1+N2=N;
   judging whether the first pseudo random bit sub-sequence contains a group of K1 consecutive bits of a same first binary value wherein K1 is an integer and 2≦K1<N1;
   judging whether the first pseudo random bit sub-sequence has a group of K2 consecutive bits of the same first binary value, the K2 consecutive bits being selected from first bits adjacent to the consecutive K1 bits or being selected from second bits of the first pseudo random bit sub-sequence other than the consecutive K1 bits wherein K2 is an integer and 2≦K2≦K1;
   inverting at least one bit of the consecutive K2 bits when the consecutive K1 bits have the same first binary value and the K2 consecutive bits have the first binary value;
   judging whether the second pseudo random bit sub-sequence has a group of K3 consecutive bits of a same second binary value when the K1 consecutive bits do not have the same first binary value or when the K2 consecutive bits do not have the first binary value wherein K3 is an integer and 2≦K3<N2; and
   inverting at least one bit of the consecutive K3 bits when the consecutive K3 bits have the same second binary value.

5. The method of claim 4, wherein upper bits of the first pseudo random bit sub-sequence are judged prior to lower bits of the first pseudo random bit sub-sequence when the K1 consecutive bits of the first pseudo random bit sub-sequence are judged to have the same first binary value.

6. The method of claim 4, wherein the at least one bit of the K2 consecutive bits being inverted includes a last bit of the K2 consecutive bits.

7. The method of claim 4, wherein the inverting of the at least one bit of the K3 consecutive bits inverts a middle bit of the K3 consecutive bits.

8. The method of claim 4, wherein said transforming the parallel pseudo random bit sequence further includes inverting even numbered bits of the second pseudo random bit sub-sequence when N3 upper bits of the pseudo random bit sequence have the same third binary value, wherein N3 is an integer and N1<N3<N.

9. The method of claim 4, wherein N1 is 6, N2 is 4, K1 is 3 and K2 is 2.

10. The method of claim 1, wherein N is 10 and M1 is 5.

11. The method of claim 1, wherein the N-bit code sequence contains 10 bits, and conforms to the output of an 8*b*/10*b* encoder.

12. An apparatus for generating an N-bit sequence, from a generated pseudo random N-bit sequence, comprising:
    a pseudo random bit sequence generator operable to generate a parallel pseudo random bit sequence having N bits wherein N is an integer and N≧2; and
    a code generating section operable to transform the pseudo random bit sequence into a parallel first bit sequence, having a number Q of consecutive "0"s or "1"s of the first bit sequence being Q≦M1 wherein Q and M1 are integers and M1<N, and further operable to invert at least one bit of the N bits of the pseudo random bit sequence to generate the first bit sequence.

13. The apparatus of claim 12, wherein the pseudo random bit sequence generator includes N stages, each of the N stages including an exclusive-OR (XOR) gate and a flip flop (FF) coupled to an output terminal of the XOR gate.

14. The apparatus of claim 13, wherein the pseudo random bit sequence generator is arranged such that
    an output signal d<i> of the FF represents the output of an $i^{th}$ stage;
    the output signals d<0>, d<1>, . . . , d<8> and d<9> represent the pseudo random bit sequence, and
    the output signals d<0>, d<1>, . . . , d<8> and d<9> are fed back as inputs to the XOR gates, respectively.

15. The apparatus of claim 12, wherein the code generating section is operable to transform the first bit sequence into a parallel second bit sequence, a number R of "0"s or "1"s of the second bit sequence being R≦M2 wherein R and M2 are integers and M2<N.

16. The apparatus of claim 12, wherein the code generating section includes:
    a transforming section operable to do the following:
       divide the pseudo random bit sequence into a parallel first pseudo random bit sub-sequence having N1 bits and a parallel second pseudo random bit sub-sequence having N2 bits, wherein N1 and N2 are integers and N1<N, N2<N and N1+N2=N,
       judge whether the first pseudo random bit sub-sequence has a group of K1 consecutive bits of a same first binary value wherein K1 is an integer and 2≦K1≦N1, and
       judge whether the first pseudo random bit sub-sequence has a group of K2 consecutive bits of the first binary value, the K2 consecutive bits being selected from first bits adjacent to the consecutive K1 bits or being selected from second bits of the first pseudo random bit sub-sequence other than the K1 consecutive bits, wherein K2 is an integer and 2≦K2,≦(K1;
    a first inverting section operable to receive the first pseudo random bit sub-sequence and to invert at least one bit of the K2 consecutive bits when the K1 consecutive bits have the same first binary value and the K2 consecutive bits have the first binary value; and
    a second inverting section operable to invert at least one bit of K3 consecutive bits of the second pseudo random bit sub-sequence when the consecutive K3 bits have a same second binary value, wherein K3 is an integer and 2≦K3≦N2.

17. The apparatus of claim 16, wherein the inverting of the at least one bit of the K2 consecutive bits inverts a last bit of the consecutive K2 bits.

18. The apparatus of claim 16, wherein the inverting of the at least one bit of the K3 consecutive bits inverts a middle bit of the consecutive K3 bits.

19. The apparatus of claim 16, wherein the transforming section is further operable to invert even numbered bits of the second pseudo random bit sub-sequence when N3 upper bits of the pseudo random bit sub-sequence have a same third binary value, wherein N3 is an integer and N1<N3<N.

20. The apparatus of claim 16, wherein N is 10, M1 is 5, N1 is 6, K1 is 3 and K2 is 2.

21. The method of claim 12, wherein the N-bit code sequence is contains 10 bits, and conforms to the output of an 8b/10b encoder.

22. A method of generating an N-bit sequence, the method comprising:
generating a pseudo random bit sequence (PRBS) having N-bits; and
forming an N-bit sequence having a limited number of consecutive "1" and "0" bits based upon the PRBS;
manipulating the PRBS to produce a manipulated bit sequence;
wherein, for each 10 bit word of the manipulated bit sequence, if there is an instance of a number v of consecutive logical one values then the number, v, of consecutive logical one values is $v \leq M1$, where M1<10, and
if there is an instance of a number w of consecutive logical zero values, then the number, w, of consecutive logical zero values is $w \leq M2$, where M2<10.

23. The method of claim 22, further comprising:
causing a high-speed interface device to operate upon the N-bit sequence.

24. The method of claim 23, wherein the high-speed interface device is a serializer.

25. The method of claim 22, wherein forming of the N-bit sequence includes:
for each 10 bit word of the manipulated bit sequence,
if there is an instance of consecutive logical one values, then a number, v, of the consecutive logical one values is $4 \leq v$ and M1=6; and
if there is an instance of consecutive logical zero values, then a number, w, of consecutive logical zero values is $4 \leq v$ and M2=6; and
wherein, for each two consecutive 10 bit words of the manipulated sequence,
if there is an instance of consecutive logical one values spanning a border between the two consecutive 10 bit words, then a number, x, of such spanning consecutive logical one values is $2 \leq x \leq 5$, and
if there is an instance of consecutive logical zero values spanning the border between the two consecutive 10 bit words, then a number, y, of such spanning consecutive logical zero values is $2 \leq y \leq 5$.

26. The method of claim 22, where the forming of the N-bit sequence includes:
wherein, for each 10 bit word of the manipulated bit sequence,
if there is an instance of consecutive logical one values, then a number, v, of the consecutive logical one values is $2 \leq v$, and M1=5; and
if there is an instance of consecutive logical zero values, then a number, w, of consecutive logical zero values is 2<w and M2 =5; and
wherein, for each two consecutive 10 bit words of the manipulated sequence,
if there is an instance of consecutive logical one values spanning a border between the two consecutive 10 bit words, then a number, x, of such spanning consecutive logical one values is $2 \leq x \leq 5$, and
if there is an instance of consecutive logical zero values spanning the border between the two consecutive 10 bit words, then a number, y, of such spanning consecutive logical zero values is $2 \leq y \leq 5$.

27. The method of claim 22, wherein the N-bit code sequence is contains 10 bits, and conforms to the output of an 8b/10b encoder.

* * * * *